US010818656B2

(12) United States Patent
Inoto et al.

(10) Patent No.: US 10,818,656 B2
(45) Date of Patent: Oct. 27, 2020

(54) SEMICONDUCTOR DEVICE

(71) Applicants:Kabushiki Kaisha Toshiba, Minato-ku, Tokyo (JP); Toshiba Electronic Devices & Storage Corporation, Minato-ku, Tokyo (JP)

(72) Inventors: Hidekazu Inoto, Ota Tokyo (JP); Osamu Takata, Kanagawa (JP); Itaru Tamura, Kanagawa (JP); Naozumi Terada, Kanagawa (JP); Hiroyoshi Kitahara, Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 16/299,750

(22) Filed: Mar. 12, 2019

(65) Prior Publication Data

US 2020/0083218 A1    Mar. 12, 2020

(30) Foreign Application Priority Data

Sep. 12, 2018  (JP) .................................. 2018-170740

(51) Int. Cl.
*H01L 27/088*         (2006.01)
*H01L 21/8234*        (2006.01)

(52) U.S. Cl.
CPC .. *H01L 27/0883* (2013.01); *H01L 21/823425* (2013.01); *H01L 21/823462* (2013.01)

(58) Field of Classification Search
CPC ... H01L 45/06; H01L 45/1286; H01L 45/144; H01L 45/143; H01L 45/1226
USPC .......................................................... 257/392
See application file for complete search history.

(56) References Cited

U.S. PATENT DOCUMENTS

| 6,713,353 | B1  | 3/2004 | Kanda et al. |
| 8,637,929 | B2  | 1/2014 | Satoh et al. |
| 2002/0070382 | A1* | 6/2002 | Yamazaki ........... G02F 1/13454 257/72 |

(Continued)

FOREIGN PATENT DOCUMENTS

| JP | 2006-165435 A | 6/2006 |
| JP | 2008-277835 A | 11/2008 |

(Continued)

*Primary Examiner* — Andy Huynh
(74) *Attorney, Agent, or Firm* — White & Case LLP

(57) ABSTRACT

A semiconductor device includes a first semiconductor region of a first conductivity type, second, third and fourth semiconductor regions of a second conductivity type, a first insulating film, a second insulating film, a first electrode contacting the first insulating film, and a second electrode contacting the second insulating film. The second and third semiconductor regions contact the first semiconductor region. The fourth semiconductor region contacts the first semiconductor region, is disposed between the second semiconductor region and the third semiconductor region. The first insulating film contacts a first portion of the first semiconductor region between the second semiconductor region and the fourth semiconductor region. The second insulating film contacts a second portion of the first semiconductor region between the third semiconductor region and the fourth semiconductor region. The second insulating film is thicker than the first insulating film.

4 Claims, 19 Drawing Sheets

(56) References Cited

U.S. PATENT DOCUMENTS

| | | | |
|---|---|---|---|
| 2006/0170047 A1 | 8/2006 | Ishimaru | |
| 2008/0254622 A1* | 10/2008 | Amos | H01L 21/28052 |
| | | | 438/683 |
| 2008/0265337 A1* | 10/2008 | Minakata | H01L 21/28202 |
| | | | 257/392 |
| 2013/0143370 A1* | 6/2013 | Chi | H01L 21/84 |
| | | | 438/151 |

FOREIGN PATENT DOCUMENTS

| | | |
|---|---|---|
| JP | 2013-222892 A | 10/2013 |
| JP | 5582030 B2 | 9/2014 |
| JP | 2015-050203 A | 3/2015 |

* cited by examiner

SEMICONDUCTOR DEVICE

CROSS-REFERENCE TO RELATED APPLICATIONS

This application is based upon and claims the benefit of priority from Japanese Patent Application No. 2018-170740, filed on Sep. 12, 2018; the entire contents of which are incorporated herein by reference.

FIELD

Embodiments relate to a semiconductor device.

BACKGROUND

A level shift circuit that converts a voltage is widely used in semiconductor devices. It is desirable to downsize the level shift circuit as much as possible while ensuring the prescribed breakdown voltage and ON-current.

DETAILED DESCRIPTION

A semiconductor device according to an embodiment, includes a first semiconductor region of a first conductivity type, a second semiconductor region of a second conductivity type, a third semiconductor region of the second conductivity type, a fourth semiconductor region of the second conductivity type, a first insulating film, a second insulating film, a first electrode contacting the first insulating film, and a second electrode contacting the second insulating film. The second semiconductor region and a third semiconductor region contact the first semiconductor region, and are separated from each other. The fourth semiconductor region contacts the first semiconductor region, is disposed between the second semiconductor region and the third semiconductor region, and is separated from the second semiconductor region and the third semiconductor region. The first insulating film contacts a first portion of the first semiconductor region between the second semiconductor region and the fourth semiconductor region. The second insulating film contacts a second portion of the first semiconductor region between the third semiconductor region and the fourth semiconductor region. The second insulating film is thicker than the first insulating film.

A semiconductor device according to an embodiment, includes a first semiconductor region of a first conductivity type, a second semiconductor region of a second conductivity type, a third semiconductor region of the second conductivity type, a first insulating film, an electrode contacting the first insulating film, a second insulating film contacting the third semiconductor region, and a third insulating film covering the electrode and the second insulating film. The second semiconductor region and the third semiconductor region contact the first semiconductor region, and are separated from each other. The first insulating film contacts a portion of the first semiconductor region between the second semiconductor region and the third semiconductor region. The second insulating film is thicker than the first insulating film.

First Embodiment

A first embodiment will now be described.

Figure 1:
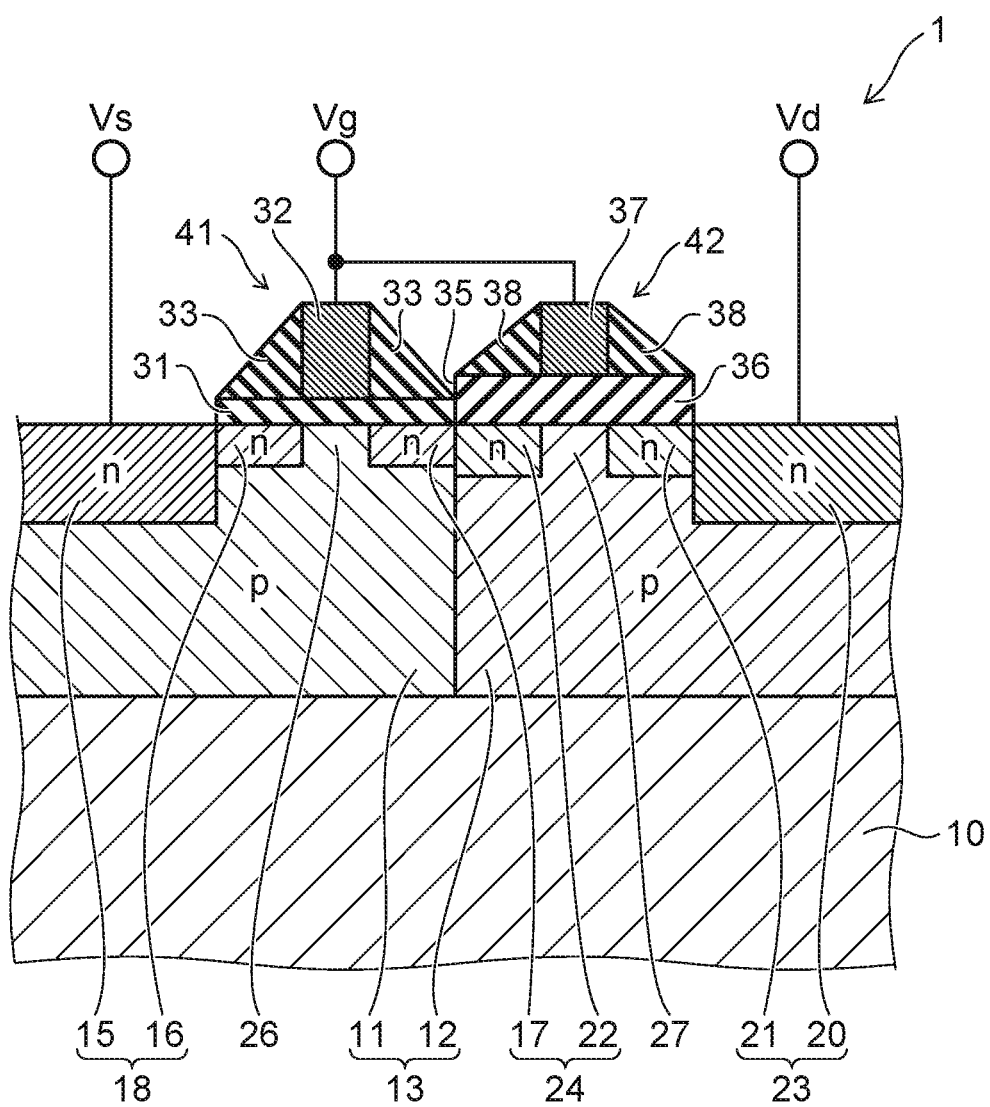
FIG. 1 is a cross-sectional view showing a semiconductor device according to a first embodiment.

FIG. 1 is a cross-sectional view showing a semiconductor device according to the embodiment.

Figure 2:
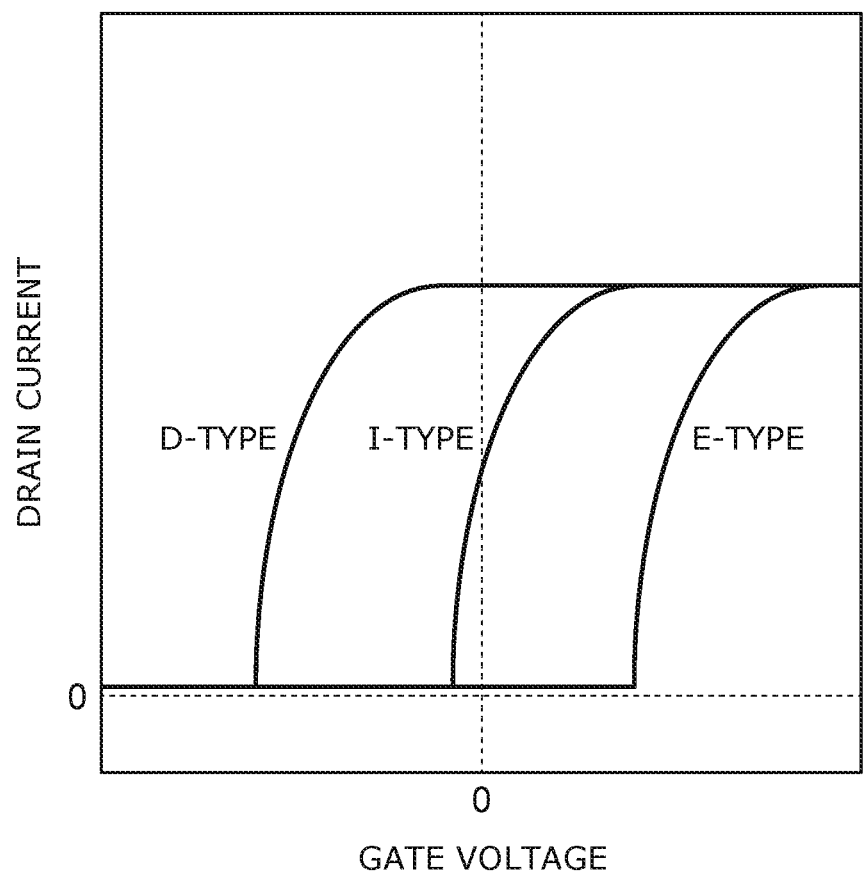
FIG. 2 is a graph showing transistor types, in which the horizontal axis is gate voltage, and the vertical axis is drain current.

FIG. 2 is a graph showing transistor types, in which the horizontal axis is the gate voltage, and the vertical axis is the drain current.

Figure 3A:
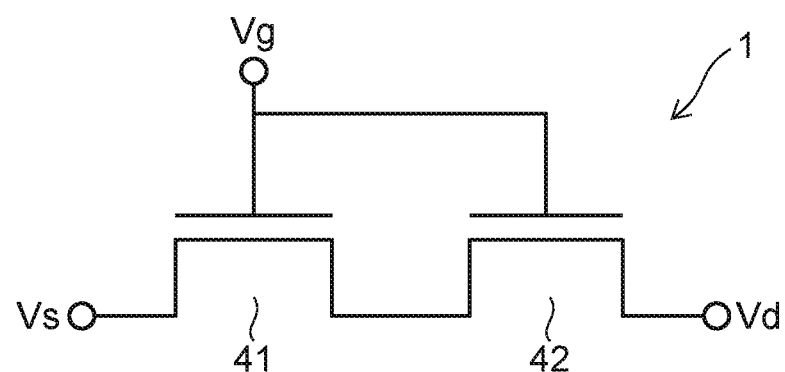
FIGS. 3A and 3B are circuit diagrams showing the semiconductor device according to the first embodiment.
Figure 3B:
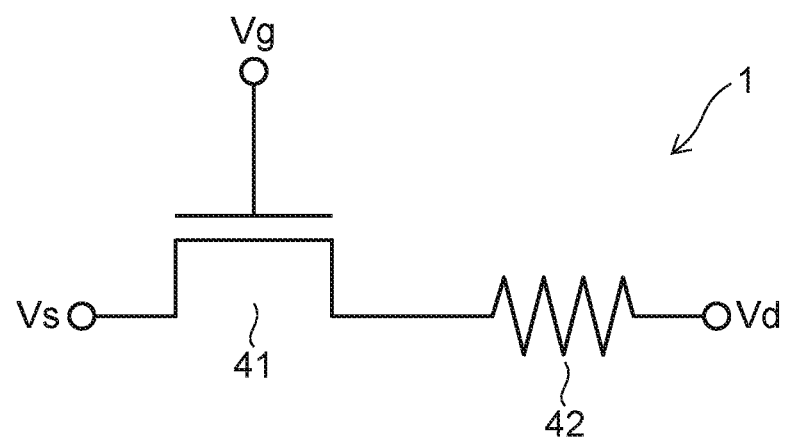

FIGS. 3A and 3B are circuit diagrams showing the semiconductor device according to the embodiment.

In the semiconductor device 1 according to the embodiment as shown in FIG. 1, for example, a low-voltage p-well 11 of a p-type conductivity and a high-voltage p-well 12 of the p-type conductivity are provided on a semiconductor substrate 10 made of single-crystal silicon (Si). The impurity concentration (the carrier concentration) of the upper layer portion of the low-voltage p-well 11 is higher than the impurity concentration (the carrier concentration) of the upper layer portion of the high-voltage p-well 12. The upper layer portions of the two p-wells include channel regions 26 and 27 described below. The impurity concentrations of the middle layer portion and the lower layer portion of the low-voltage p-well 11 are substantially equal to the impurity concentrations of the middle layer portion and the lower layer portion of the high-voltage p-well 12. One continuous p-type semiconductor region 13 is formed of the low-voltage p-well 11 and the high-voltage p-well 12.

A source region 15 and LDD regions 16 and 17 of n-type conductivities are provided on the low-voltage p-well 11. The source region 15 and the LDD regions 16 and 17 contact the low-voltage p-well 11. The impurity concentrations of the LDD regions 16 and 17 are lower than the impurity concentration of the source region 15. The LDD region 16 contacts the source region 15. One continuous n-type semiconductor region 18 is formed of the source region 15 and the LDD region 16. The LDD region 17 is separated from the n-type semiconductor region 18.

A drain region 20 and LDD regions 21 and 22 of n-type conductivities are provided on the high-voltage p-well 12. The drain region 20 and the LDD regions 21 and 22 contact the high-voltage p-well 12. The impurity concentrations of the LDD regions 21 and 22 are lower than the impurity concentration of the drain region 20 and lower than the impurity concentrations of the LDD regions 16 and 17. The LDD region 21 contacts the drain region 20. One continuous n-type semiconductor region 23 is formed of the drain region 20 and the LDD region 21. The LDD region 22 is separated from the n-type semiconductor region 23.

The LDD region 22 contacts the LDD region 17. One continuous n-type semiconductor region 24 is formed of the LDD region 22 and the LDD region 17. The n-type semiconductor region 24 is separated from the n-type semiconductor region 18 and the n-type semiconductor region 23. A portion of the upper layer portion of the low-voltage p-well 11 is interposed between the n-type semiconductor region 18 and the n-type semiconductor region 24 and is used as the channel region 26. A portion of the upper layer portion of the high-voltage p-well 12 is interposed between the n-type semiconductor region 23 and the n-type semiconductor region 24 and is used as the channel region 27.

A gate insulating film 31 is provided on the LDD region 16, the channel region 26, and the LDD region 17. The gate insulating film 31 is made from, for example, silicon oxide (SiO); and the thickness of the gate insulating film 31 is, for example, 2.5 nm (nanometers) or less. The gate insulating film 31 contacts the LDD region 16, the channel region 26, and the LDD region 17. A gate electrode 32 that is made of, for example, polysilicon is provided on the gate insulating film 31 in the region directly above the channel region 26. Sidewalls 33 that are made of, for example, silicon oxide are provided on the gate insulating film 31 in the regions directly above the LDD regions 16 and 17. The sidewalls 33 contact the gate electrode 32.

A gate insulating film 36 is provided on the LDD region 21, the channel region 27, and the LDD region 22. The gate insulating film 36 is made from the same insulating material as the gate insulating film 31 and is thicker than the gate insulating film 31. For example, the gate insulating film 36 is made from silicon oxide; and the thickness of the gate insulating film 36 is 12.5 nm or more. The gate insulating film 36 contacts the LDD region 21, the channel region 27, and the LDD region 22. A gate electrode 37 that is made of, for example, polysilicon is provided on the gate insulating film 36 in the region directly above the channel region 27. Sidewalls 38 that are made of, for example, silicon oxide are provided on the gate insulating film 36 in the regions directly above the LDD regions 21 and 22. The sidewalls 38 contact the gate electrode 37.

The gate insulating film 36 contacts the gate insulating film 31; and the boundary between the gate insulating film 36 and the gate insulating film 31 is a level difference 35. The level difference 35 is positioned between the gate electrode 32 and the gate electrode 37 and is separated from the gate electrode 32 and the gate electrode 37. In other words, the gate electrode 32 is separated from the end edge of the gate insulating film 31 on the gate insulating film 36 side; and the gate electrode 37 is separated from the end edge of the gate insulating film 36 on the gate insulating film 31 side.

A transistor 41 is formed of the sidewalls 33, the gate electrode 32, the gate insulating film 31, the LDD regions 16 and 17, the source region 15, and the low-voltage p-well 11 including the channel region 26. The transistor 41 is an n-channel MOSFET (Metal-Oxide-Semiconductor Field-Effect Transistor) and is the E-type transistor shown in FIG. 2.

A transistor 42 is formed of the sidewalls 38, the gate electrode 37, the gate insulating film 36, the LDD regions 21 and 22, the drain region 20, and the high-voltage p-well 12 including the channel region 27. The transistor 42 is an n-channel MOSFET and is the I-type or D-type transistor shown in FIG. 2. The gate-drain breakdown voltage of the transistor 42 is higher than the gate-drain breakdown voltage of the transistor 41.

The gate electrode 37 is connected to the gate electrode 32. A gate potential Vg is applied to the gate electrodes 32 and 37. On the other hand, a source potential Vs is applied to the source region 15. A drain potential Vd is applied to the drain region 20. The gate potential Vg is an ON potential Von that sets the transistor 41 to the conducting state, or an OFF potential Voff that sets the transistor 41 to the nonconducting state. In an example, the source potential Vs and the OFF potential Voff are 0 V (volts); the drain potential Vd is 5 V; and the ON potential Von is 1.5 V. On the other hand, the transistor 42 is in the conducting state regardless of whether the gate potential Vg applied to the gate electrode 37 is the ON potential Von (e.g., 1.5 V) or the OFF potential Voff (e.g., 0 V).

Therefore, although the structure of the semiconductor device 1 is a circuit configuration in which the transistor 41 and the transistor 42 are connected in series as shown in FIG. 3A, when operated under the conditions described above, the transistor 42 is constantly in the conducting state; therefore, as shown in FIG. 3B, the transistor 42 functions not as a switching element but as a resistance element. For example, a level shift circuit that converts a voltage of 1.5 V into a voltage of 5 V is configured using the transistors 41 and 42.

A method for manufacturing the semiconductor device according to the embodiment will now be described.

FIG. 4 to FIG. 16 are cross-sectional views showing the method for manufacturing the semiconductor device according to the embodiment.

Figure 4:
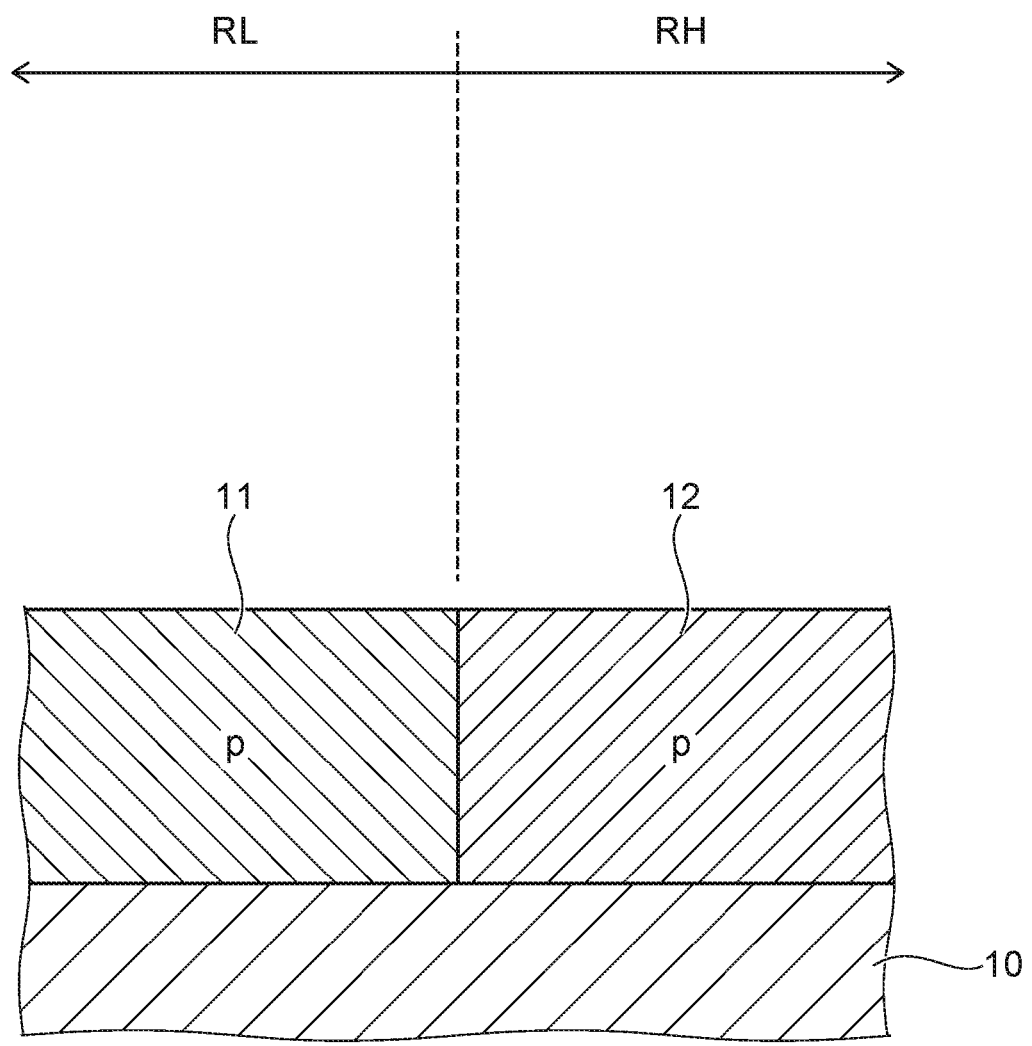
FIG. 4 to FIG. 16 are cross-sectional views showing a method for manufacturing the semiconductor device according to the first embodiment.

As shown in FIG. 4, for example, a low-breakdown voltage transistor region RL and a high-breakdown voltage transistor region RH are set in the semiconductor substrate 10 made of a single crystal of silicon. Then, in the upper layer portion of the semiconductor substrate 10, the low-voltage p-well 11 is formed in the low-breakdown voltage transistor region RL; and the high-voltage p-well 12 is formed in the high-breakdown voltage transistor region RH.

Figure 5:
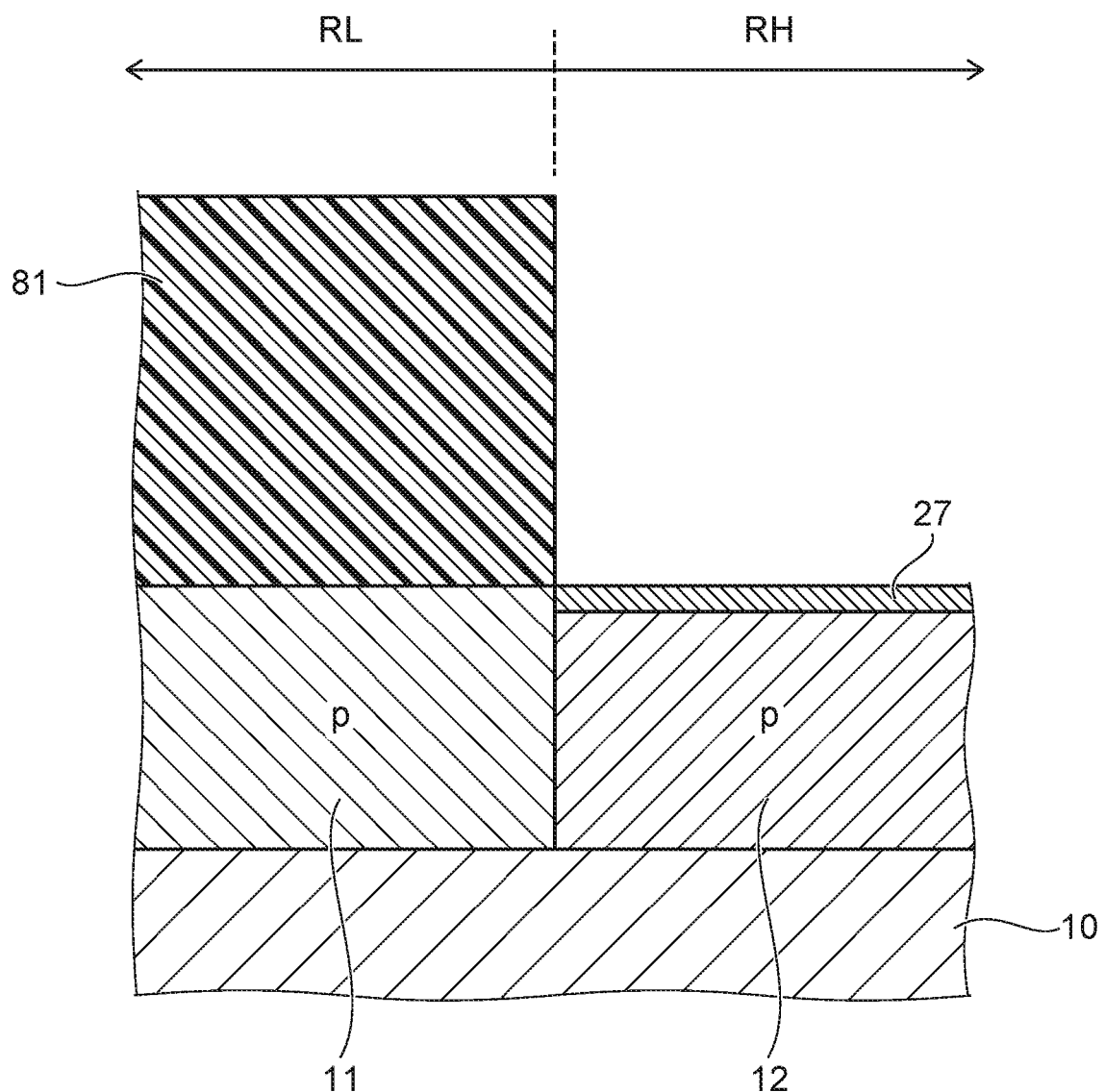

Continuing as shown in FIG. 5, a resist mask 81 is formed so that the high-breakdown voltage transistor region RH is in an opening. Then, an impurity that forms acceptors is ion-implanted using the resist mask 81 as a mask. Thereby, the channel region 27 is formed in the upper layer portion of the high-voltage p-well 12. Then, the resist mask 81 is removed.

Figure 6:
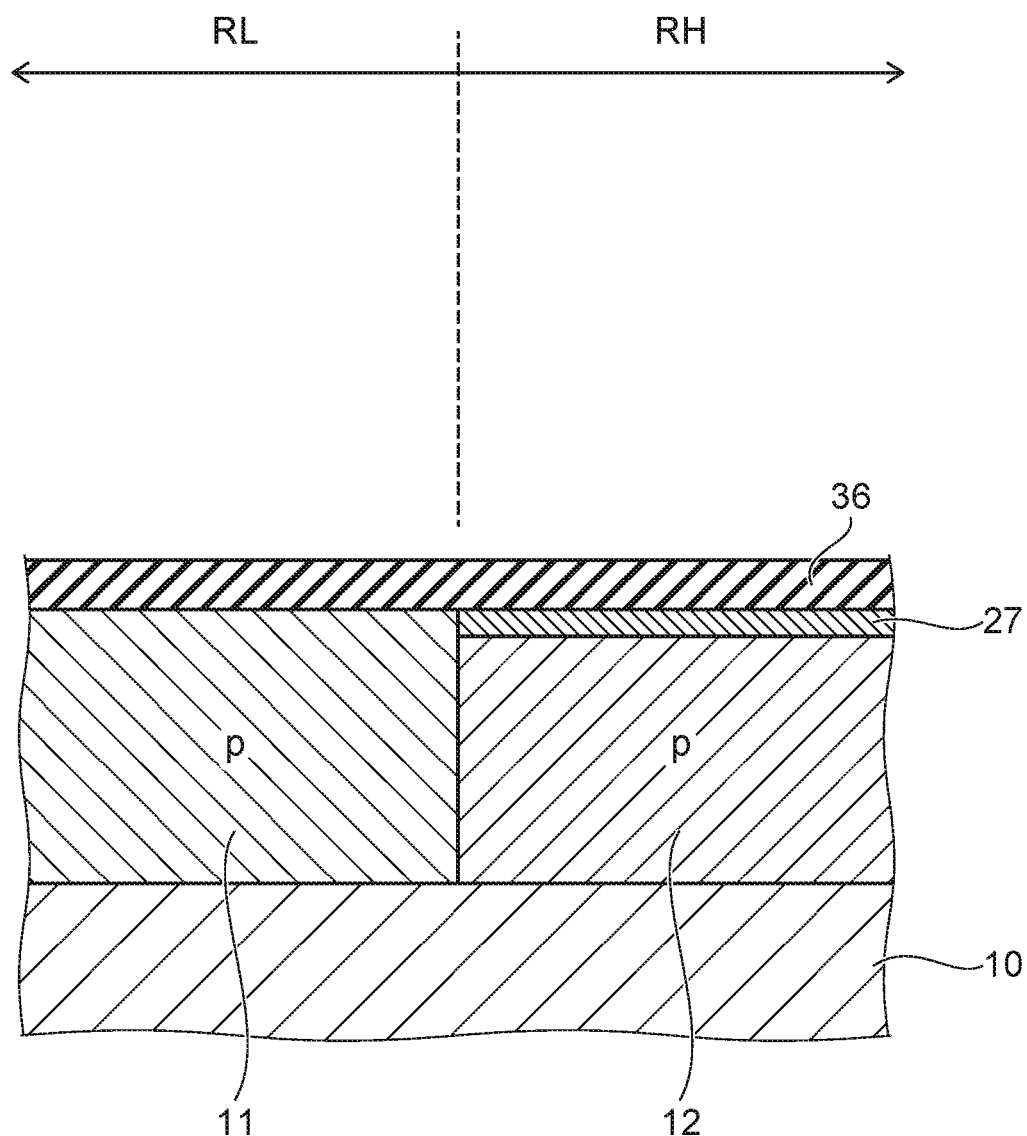

Then, as shown in FIG. 6, heat treatment is performed in an oxidation atmosphere. Thereby, the gate insulating film 36 is formed on the entire surface.

Figure 7:
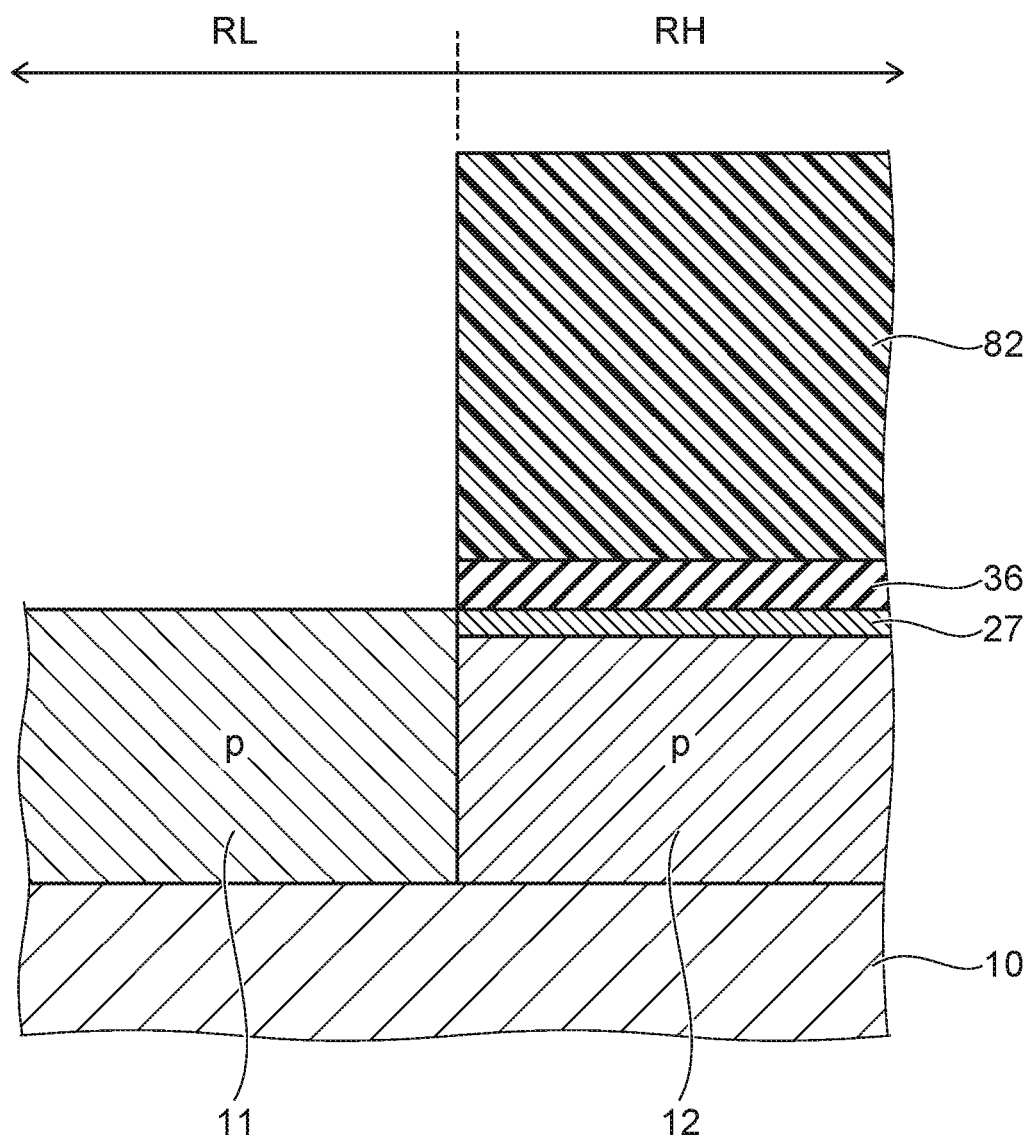

Continuing as shown in FIG. 7, a resist mask 82 is formed so that the low-breakdown voltage transistor region RL is in an opening. Then, the gate insulating film 36 is removed from the low-breakdown voltage transistor region RL by performing etching such as RIE (Reactive Ion Etching), etc., using the resist mask 82 as a mask.

Figure 8:
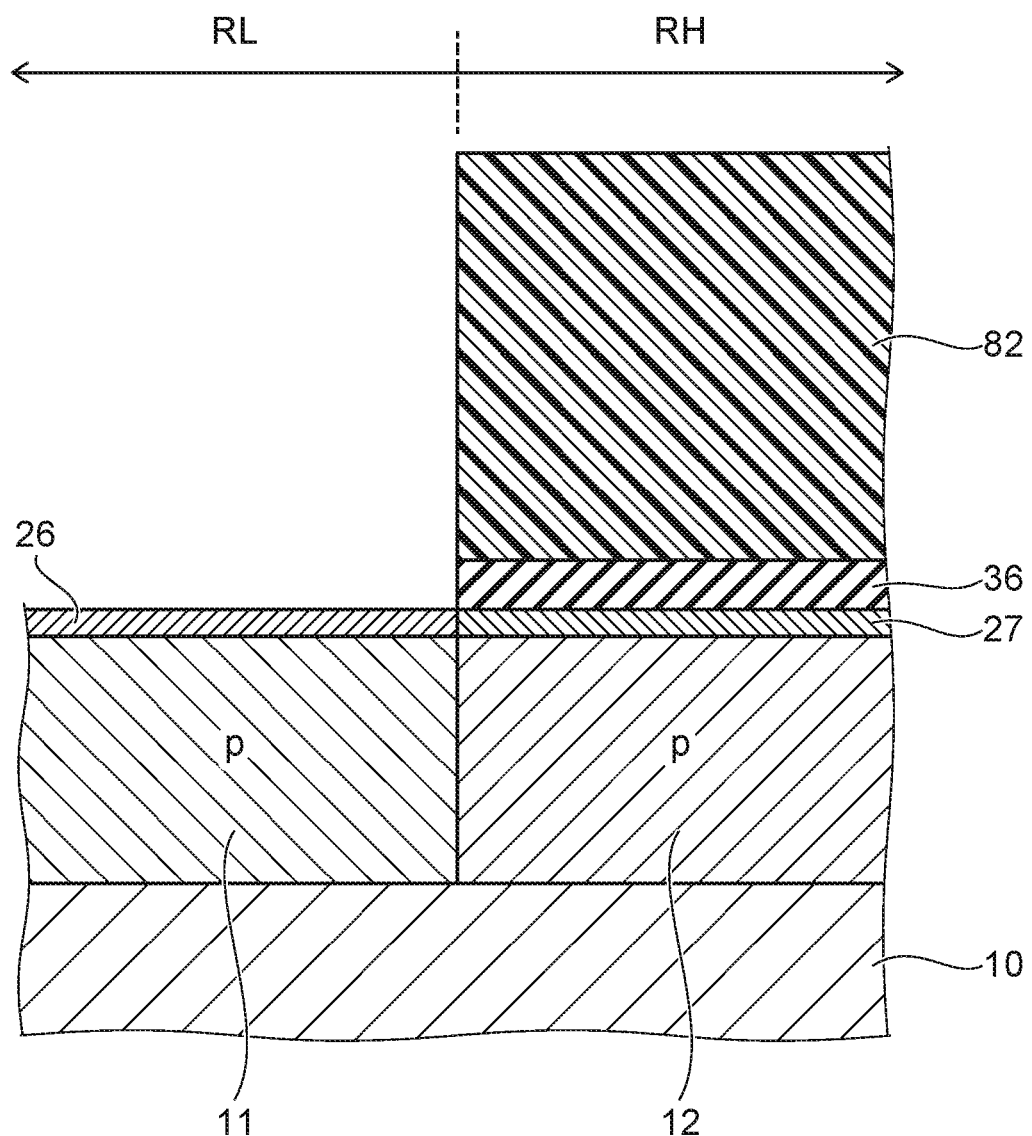

Then, as shown in FIG. 8, an impurity that forms acceptors is ion-implanted using the resist mask 82 as a mask. Thereby, the channel region 26 is formed in the upper layer portion of the low-voltage p-well 11. Then, the resist mask 82 is removed.

Figure 9:
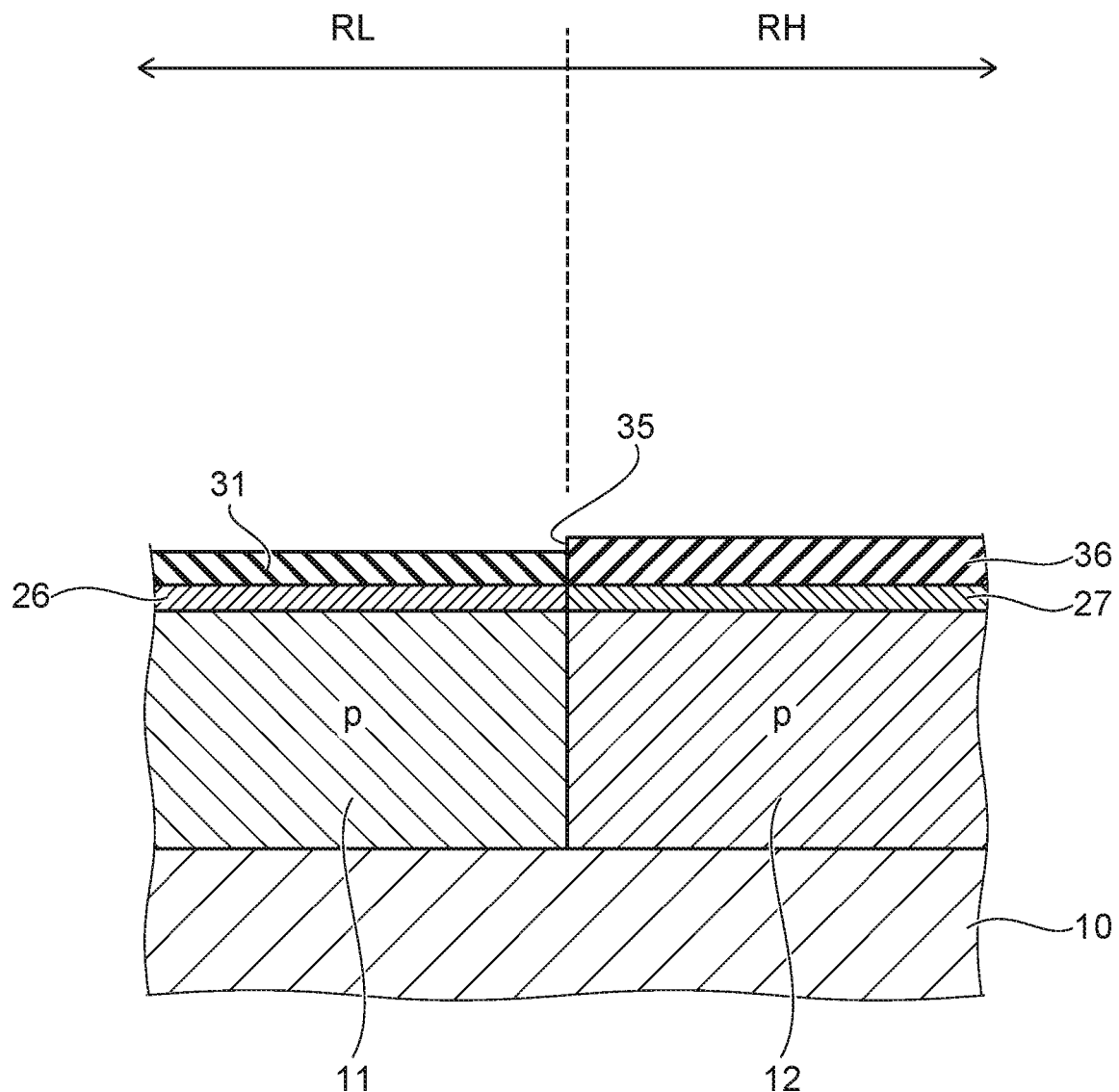

Continuing as shown in FIG. 9, heat treatment is performed in an oxidation atmosphere. Thereby, the gate insulating film 31 is formed on the channel region 26 in the low-breakdown voltage transistor region RL. The gate insulating film 31 is formed to be thinner than the gate insulating film 36. In this process, the thermal oxidation progresses also in the high-breakdown voltage transistor region RH; and the gate insulating film 36 becomes even thicker. The level difference 35 is formed at the boundary between the gate insulating film 31 and the gate insulating film 36.

Figure 10:
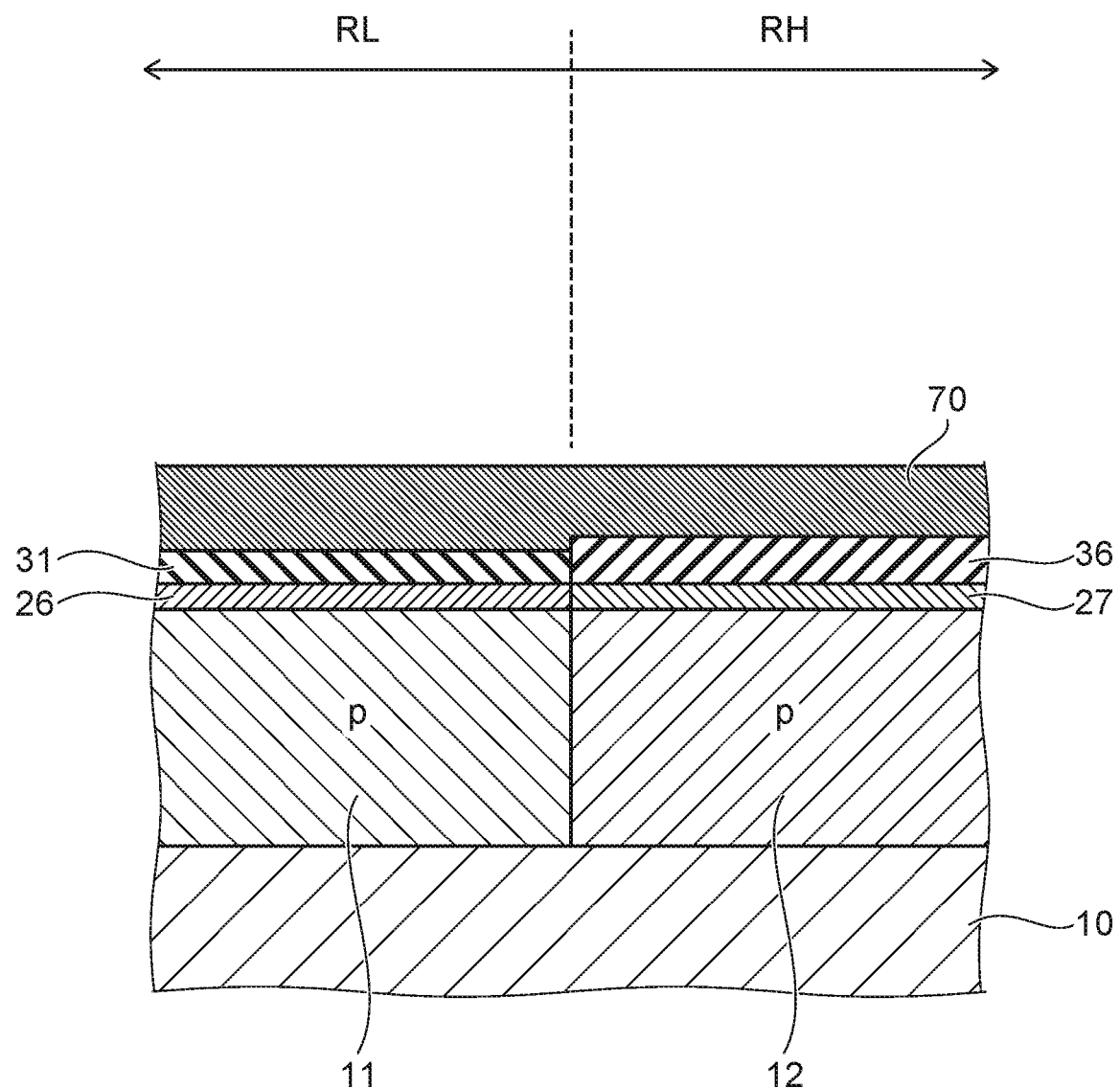

Then, as shown in FIG. 10, a polysilicon film 70 is formed on the entire surface.

Figure 11:
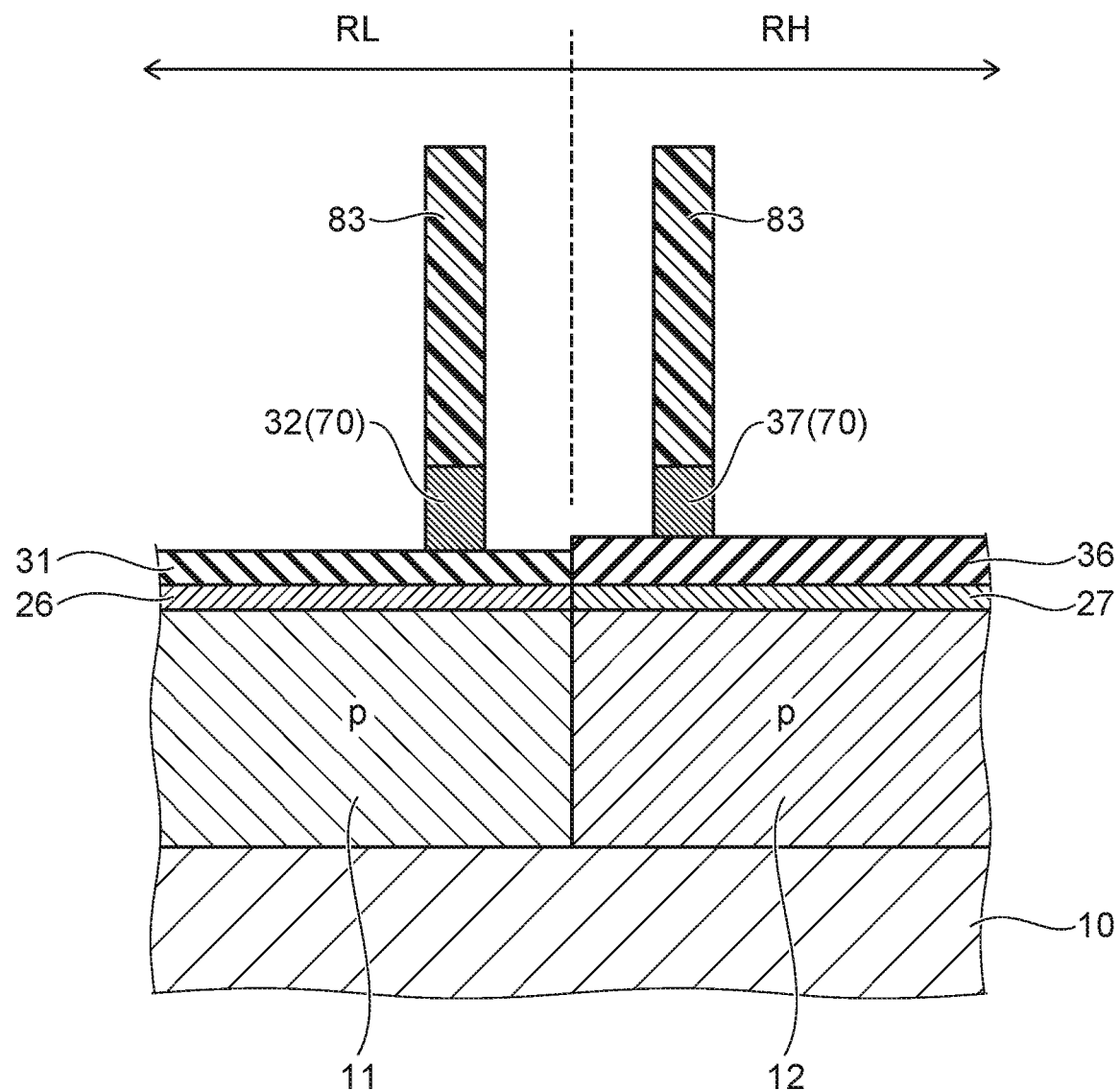

Continuing as shown in FIG. 11, a resist mask 83 is formed to cover a portion of the low-breakdown voltage transistor region RL and a portion of the high-breakdown voltage transistor region RH. Then, etching such as RIE or the like is performed using the resist mask 83 as a mask.

Thereby, the polysilicon film 70 is patterned; the gate electrode 32 is formed in the low-breakdown voltage transistor region RL; and the gate electrode 37 is formed in the high-breakdown voltage transistor region RH. Then, the resist mask 83 is removed.

Figure 12:
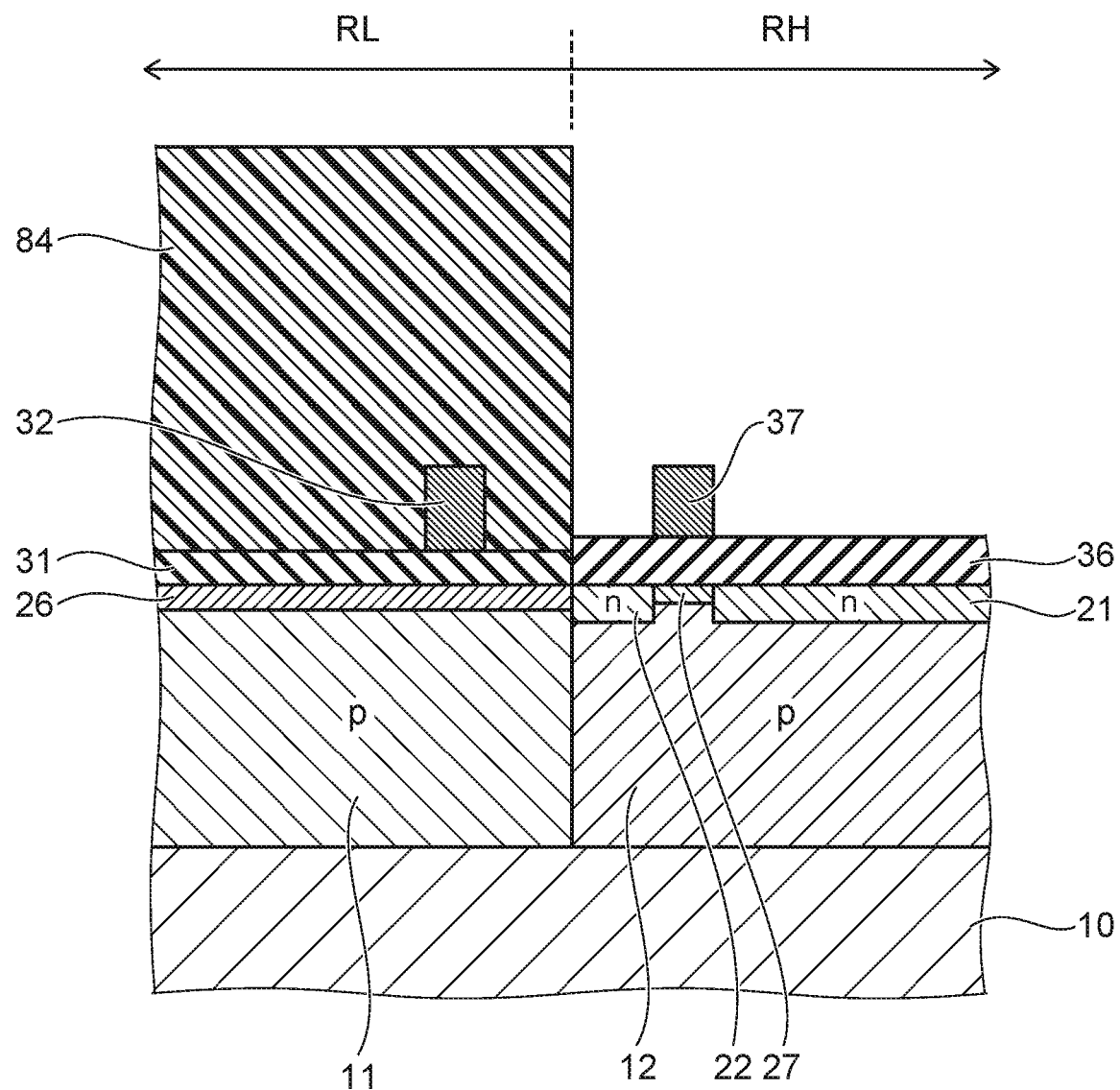

Then, as shown in FIG. 12, a resist mask 84 is formed so that the high-breakdown voltage transistor region RH is in an opening. Then, an impurity that forms donors is ion-implanted using the resist mask 84 and the gate electrode 37 as a mask. Thereby, the n-type LDD regions 21 and 22 are formed in portions of the upper layer portion of the high-voltage p-well 12 other than the region directly under the gate electrode 37. Then, the resist mask 84 is removed.

Figure 13:
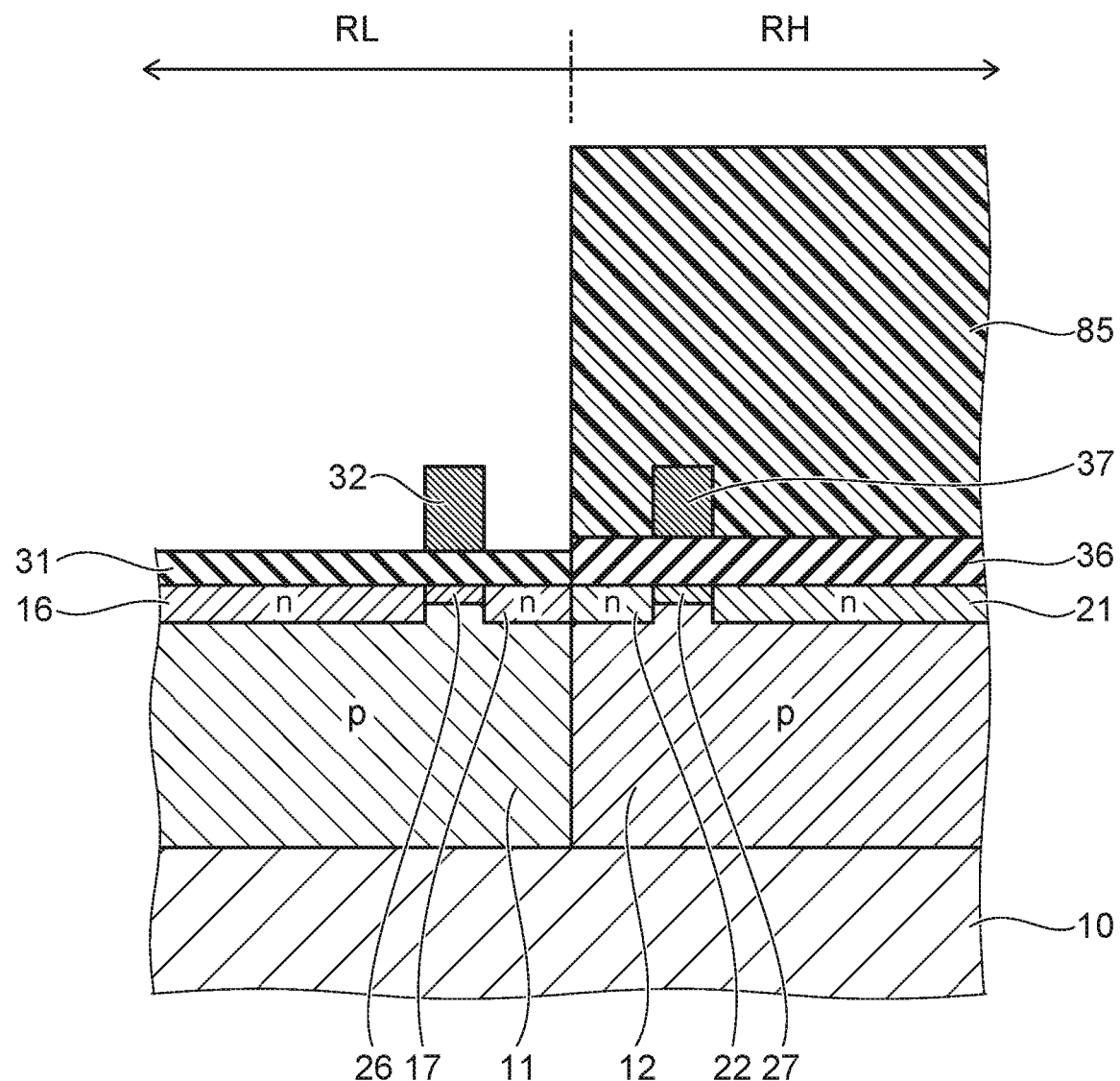

Continuing as shown in FIG. 13, a resist mask 85 is formed so that the low-breakdown voltage transistor region RL is in an opening. Then, an impurity that forms donors is ion-implanted using the resist mask 85 and the gate electrode 32 as a mask. Thereby, the n-type LDD regions 16 and 17 are formed in portions of the upper layer portion of the low-voltage p-well 11 other than the region directly under the gate electrode 32. Then, the resist mask 85 is removed.

Figure 14:
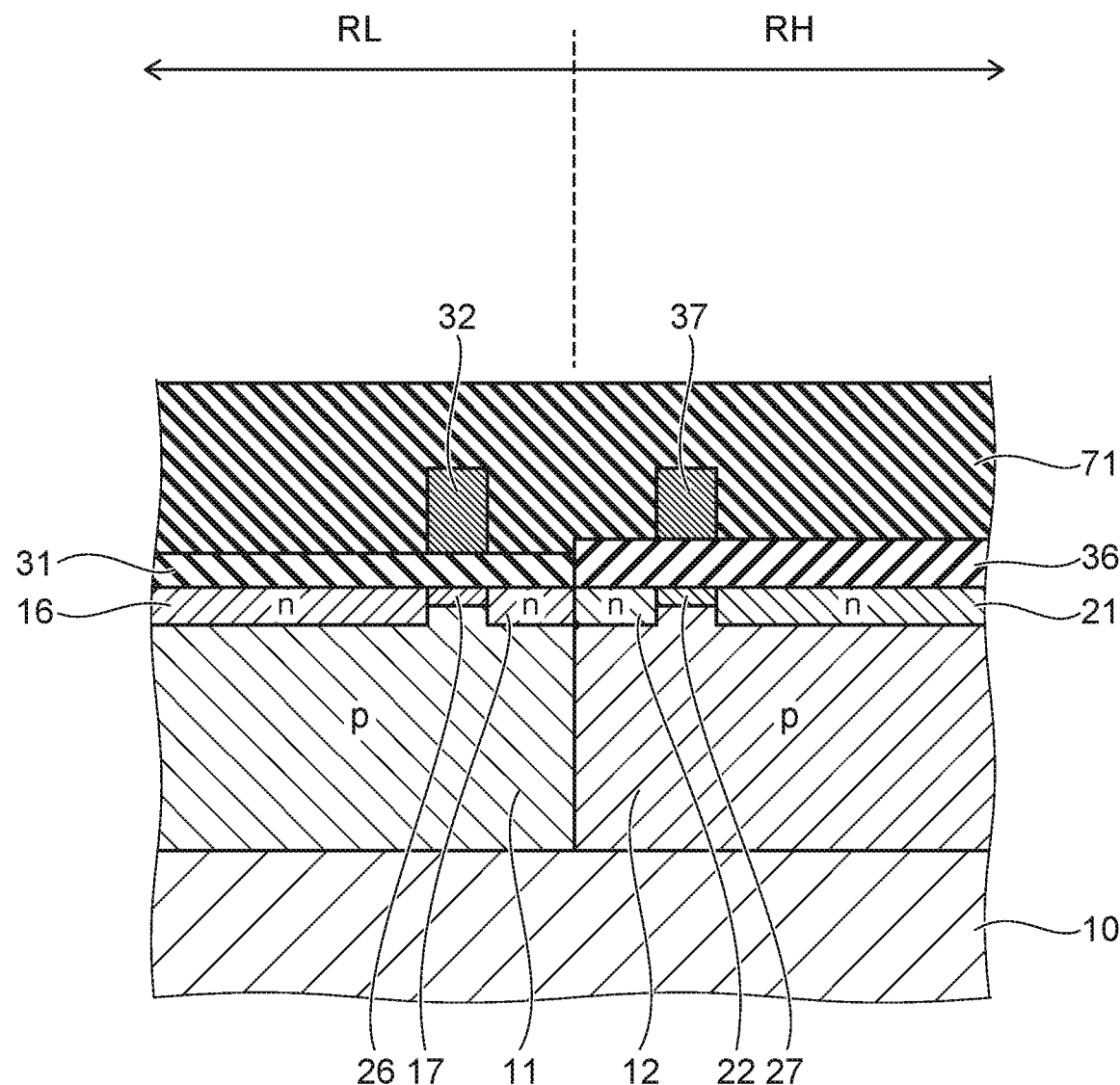

Then, as shown in FIG. 14, an insulating film 71 is formed on the entire surface. For example, the insulating film 71 is formed by depositing silicon oxide.

Figure 15:
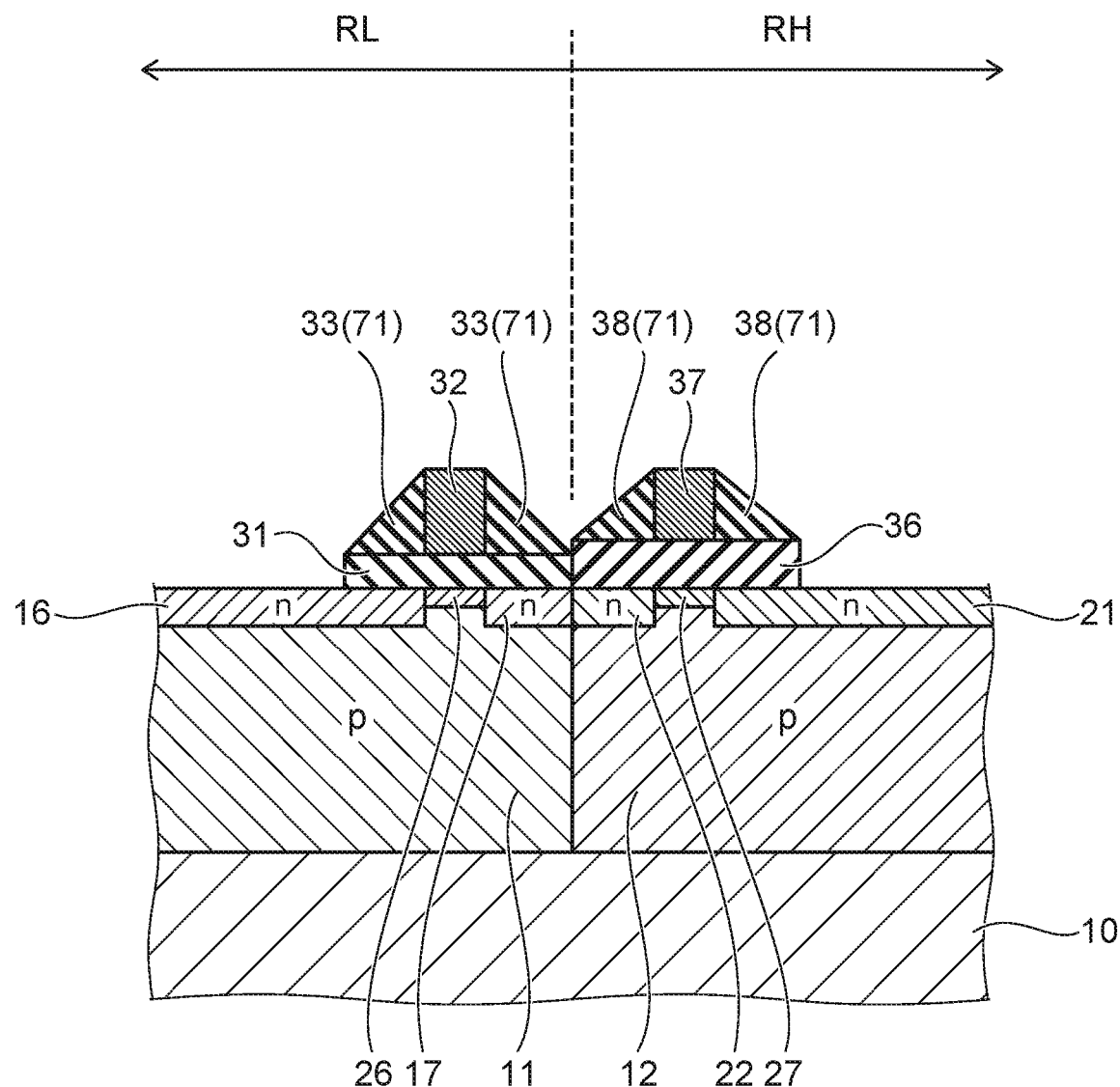

Continuing as shown in FIG. 15, etch-back of the insulating film 71 is performed. Thereby, the insulating film 71 remains on the side surfaces of the gate electrode 32 and on the side surfaces of the gate electrode 37; and the sidewalls 33 and 38 are formed.

Figure 16:
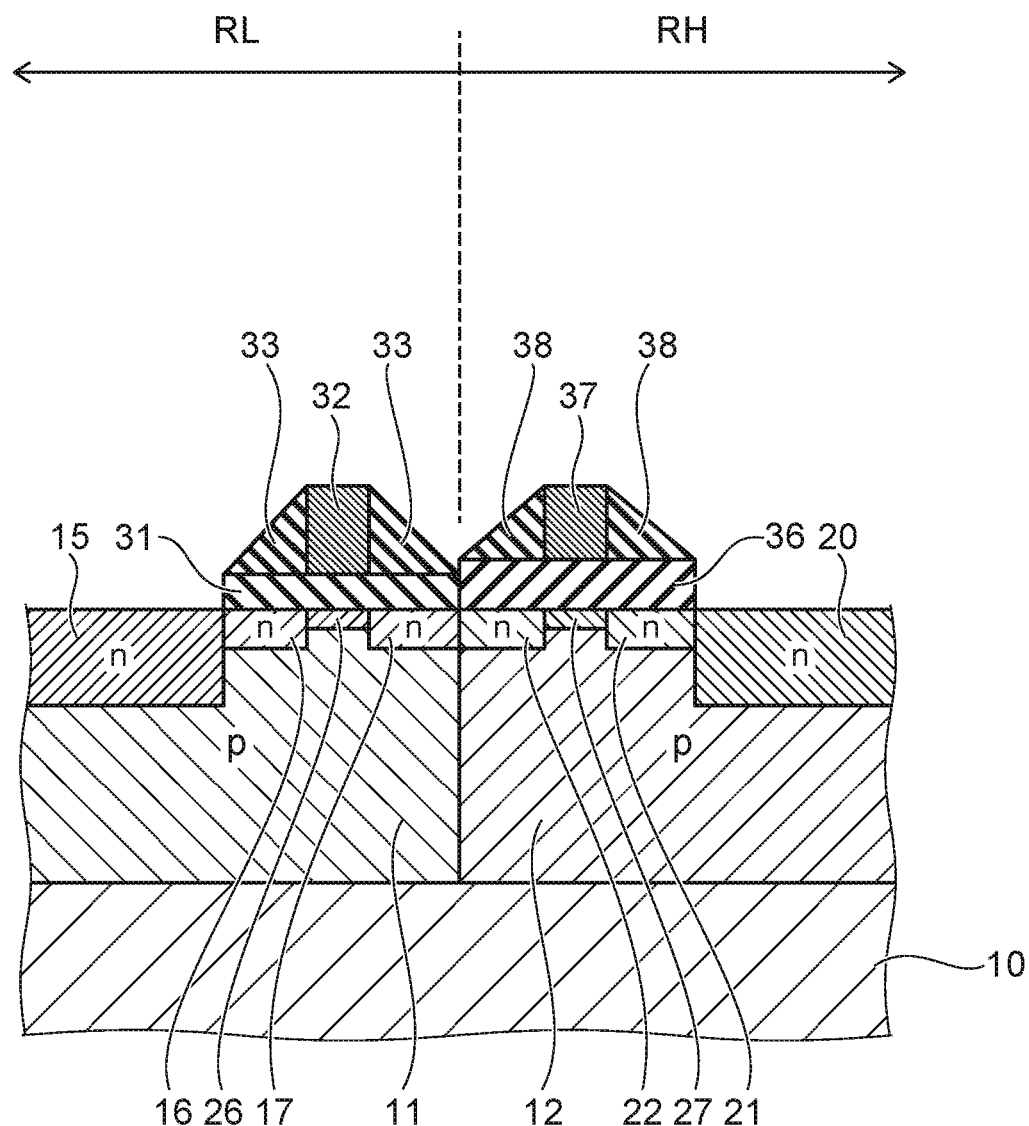

Then, as shown in FIG. 16, an impurity that forms donors is ion-implanted using the gate electrodes 32 and 37 and the sidewalls 33 and 38 as a mask. Thereby, the n-type source region 15 is formed in a portion of the upper layer portion of the low-voltage p-well 11 other than the regions directly under the gate electrode 32 and the sidewalls 33; and the n-type drain region 20 is formed in a portion of the upper layer portion of the high-voltage p-well 12 other than the regions directly under the gate electrode 37 and the sidewalls 38.

Continuing, silicide layers (not illustrated) are formed in the upper layer portions of the source region 15, the drain region 20, and the gate electrodes 32 and 37. Then, a stopper film 55 (referring to FIG. 19) that is made of silicon nitride is formed on the entire surface. Then, an inter-layer insulating film 56 (referring to FIG. 19) is formed by depositing silicon oxide on the entire surface. Then, contacts 57, 58, and 59 (referring to FIG. 19) that reach the source region 15, the drain region 20, and the gate electrodes 32 and 37 are formed inside the inter-layer insulating film 56. Then, an upper layer interconnect (not illustrated) is formed; and the gate electrode 37 is connected to the gate electrode 32. Thus, the semiconductor device 1 according to the embodiment is manufactured.

Effects of the embodiment will now be described.

As shown in FIG. 1, for example, 0 V is applied to the source region 15 as the source potential Vs; 5 V is applied to the drain region 20 as the drain potential Vd; and 0 V is applied to the gate electrodes 32 and 37 as the OFF potential Voff. Thereby, the transistor 41 is set to the nonconducting state. The transistor 42 is in the conducting state.

At this time, voltages are applied between the low-voltage p-well 11 and the gate electrode 32 and between the high-voltage p-well 12 and the gate electrode 37. Because the gate potential Vg is equal to the source potential Vs, the voltage that is applied between the high-voltage p-well 12 and the gate electrode 37 is higher than the voltage applied between the low-voltage p-well 11 and the gate electrode 32. However, a sufficient breakdown voltage can be realized because the thick gate insulating film 36 is interposed between the high-voltage p-well 12 and the gate electrode 37.

On the other hand, when 1.5 V is applied to the gate electrodes 32 and 37 as the ON potential Von, the transistor 41 is set to the conducting state. The transistor 42 remains in the conducting state. Thereby, an ON-current flows between the source region 15 and the drain region 20. At this time, a large current can be caused to flow because the thin gate insulating film 31 is interposed between the low-voltage p-well 11 and the gate electrode 32. In other words, the gate widths of the transistors 41 and 42, i.e., the lengths of the transistors 41 and 42 in a direction perpendicular to the page surface of FIG. 1, can be shortened while ensuring a constant ON-current. As a result, the transistors 41 and 42 can be downsized. Thus, according to the embodiment, the gate widths of the transistors 41 and 42 can be reduced while ensuring the prescribed breakdown voltage and ON-current; and downsizing of the semiconductor device 1 can be realized.

Also, according to the embodiment, the gate electrodes 32 and 37 are separated from the level difference 35 between the gate insulating film 31 and the gate insulating film 36. Thereby, the formation of trap sites at the vicinity of the level difference 35 can be suppressed; and the reliability of the semiconductor device 1 can be increased.

First Comparative Example

Figure 17:
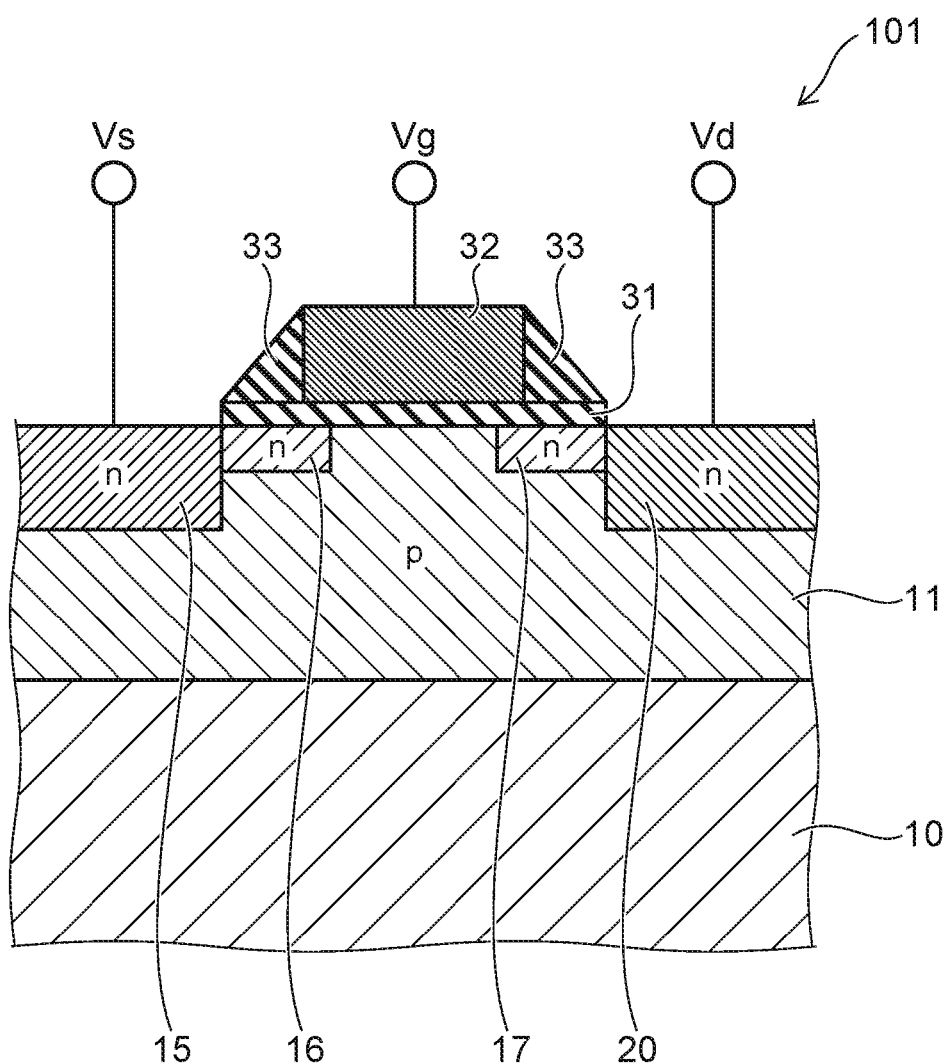
FIG. 17 is a cross-sectional view showing a semiconductor device according to a first comparative example.

FIG. 17 is a cross-sectional view showing a semiconductor device according to the comparative example.

In the semiconductor device 101 according to the comparative example as shown in FIG. 17, the level shift circuit is configured using only the transistor 41. In such a case, the gate insulating film 31 is thin; therefore, it is difficult to ensure the necessary breakdown voltage between the gate-drain.

Second Comparative Example

Figure 18:
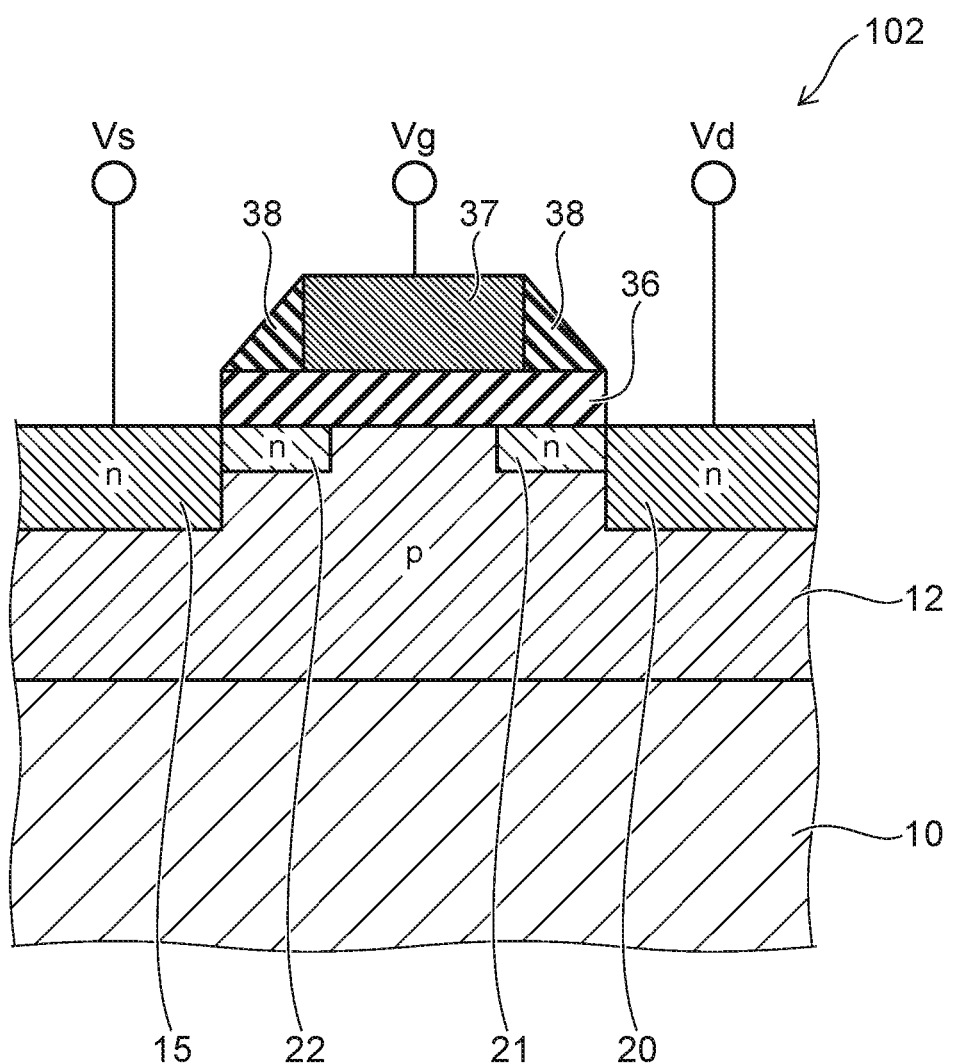
FIG. 18 is a cross-sectional view showing a semiconductor device according to a second comparative example.

FIG. 18 is a cross-sectional view showing a semiconductor device according to the comparative example.

In the semiconductor device 102 according to the comparative example as shown in FIG. 18, the level shift circuit is configured using only the transistor 42. In such a case, the gate insulating film 36 is thick; therefore, the breakdown voltage between the gate-drain can be ensured; but the current density of the ON-current is small. Accordingly, it is necessary to widen the gate width to ensure the prescribed ON-current. In an example, it is necessary to set the gate width of the semiconductor device 102 to be about 4 times the gate width of the semiconductor device 1 according to the first embodiment (referring to FIG. 1).

Second Embodiment

A second embodiment will now be described.

Figure 19:
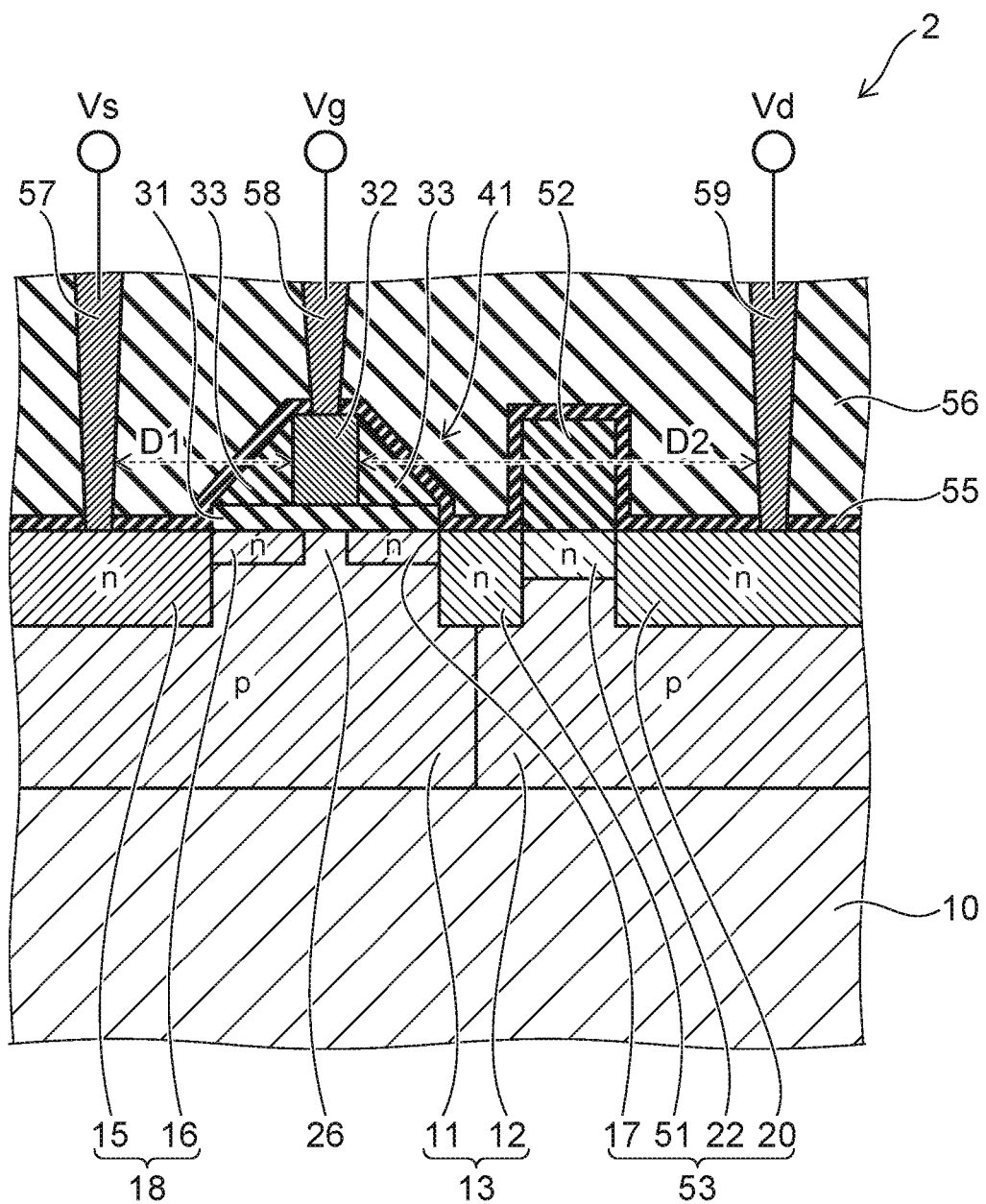
FIG. 19 is a cross-sectional view showing a semiconductor device according to a second embodiment.

FIG. 19 is a cross-sectional view showing a semiconductor device according to the embodiment.

As shown in FIG. 19, the semiconductor device 2 according to the embodiment differs from the semiconductor device 1 according to the first embodiment described above (referring to FIG. 1) in that the transistor 42 is not provided. Also, in the gate-length direction, an n-type semiconductor region 53 on the drain side is longer than the n-type semiconductor region 23 of the semiconductor device 1 (referring to FIG. 1). Thereby, the circuit shown in FIG. 3B is realized.

Specifically, in the semiconductor device 2, the LDD region 21, the channel region 27, the gate insulating film 36, the gate electrode 37, and the sidewalls 38 are not provided; and a semiconductor region 51 that is of an n-type conductivity and an insulating film 52 are provided.

The semiconductor region 51 is provided over an upper layer portion of the low-voltage p-well 11 and an upper layer portion of the high-voltage p-well 12 and contacts the LDD regions 17 and 22. One continuous n-type semiconductor region 53 is formed of the drain region 20, the LDD region 22, the semiconductor region 51, and the LDD region 17. Also, the insulating film 52 is provided on the LDD region 22 and contacts the LDD region 22. The insulating film 52 is thicker than the gate insulating film 31. The composition of the insulating film 52 is substantially the same as the composition of the sidewall 33.

In the semiconductor device 2, the stopper film 55 that is made of, for example, silicon nitride (SiN) is provided to cover the source region 15, the gate electrode 32, the sidewalls 33, the semiconductor region 51, the insulating film 52, and the drain region 20. The inter-layer insulating film 56 that is made of, for example, silicon oxide is provided on the stopper film 55. The composition of the stopper film 55 is different from the composition of the insulating film 52 and the composition of the inter-layer insulating film 56.

The contact 57 that is connected to the source region 15, the contact 58 that is connected to the gate electrode 32, and the contact 59 that is connected to the drain region 20 are provided inside the inter-layer insulating film 56. A distance D1 between the contact 57 and the gate electrode 32 is shorter than a distance D2 between the contact 59 and the gate electrode 32. In other words, D1<D2. The stopper film 55, the inter-layer insulating film 56, and the contacts 57, 58, and 59 are provided also in the semiconductor device 1 according to the first embodiment but are not illustrated in FIG. 1.

Effects of the embodiment will now be described.

In the semiconductor device 2 as well, the thin gate insulating film 31 is provided between the channel region 26 and the gate electrode 32; therefore, the current density of the ON-current can be high. Also, the distance D1 between the contact 57 and the gate electrode 32 is shorter than the distance D2 between the contact 59 and the gate electrode 32; therefore, the potential of the channel region 26 is nearer to the source potential Vs than to the drain potential Vd when the transistor 41 is set to the nonconducting state. Thereby, the application of a high voltage to the gate insulating film 31 can be avoided when setting the gate potential Vg to the same OFF potential Voff as the source potential Vs. As a result, the breakdown voltage of the semiconductor device 2 is high. Thus, according to the embodiment as well, the gate width can be reduced while ensuring the prescribed breakdown voltage and ON-current. Otherwise, the configuration, the operations, and the effects of the embodiment are similar to those of the first embodiment.

According to the embodiments described above, a semiconductor device can be realized in which downsizing is possible.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, an example is described in the embodiments described above in which the transistors 41 and 42 are n-channel MOSFETs; but the transistors 41 and 42 may be p-channel MOSFETs. Also, impurity diffusion layers, insulating films, STI (Shallow Trench Isolation (element-separating insulating films)), etc., may be added to the components described above as necessary.

What is claimed is:

1. A semiconductor device, comprising:
   a first semiconductor region of a first conductivity type;
   a second semiconductor region and a third semiconductor region contacting the first semiconductor region, being separated from each other, and being of a second conductivity type;
   a first insulating film contacting a portion of the first semiconductor region between the second semiconductor region and the third semiconductor region;
   an electrode contacting the first insulating film;
   a second insulating film contacting the third semiconductor region and being thicker than the first insulating film; and
   a third insulating film covering the electrode and the second insulating film;
   wherein the third semiconductor region includes:
      a first portion opposing the second semiconductor region;
      a second portion contacting the first portion, an impurity concentration of the second portion being higher than an impurity concentration of the first portion;
      a third portion contacting the second portion, an impurity concentration of the third portion being lower than the impurity concentration of the second portion; and
      a fourth portion contacting the third portion, an impurity concentration of the fourth portion being higher than the impurity concentration of the third portion,
   the first portion, the second portion, the third portion, and the fourth portion are arranged in this order, and
   the second insulating film contacts the third portion.

2. The device according to claim 1, further comprising:
   a first contact provided inside the third insulating film and connected to the second semiconductor region; and
   a second contact provided inside the third insulating film and connected to the third semiconductor region,
   a distance between the first contact and the electrode being shorter than a distance between the second contact and the electrode.

3. The device according to claim 1, further comprising a fourth insulating film disposed between the second insulating film and the third insulating film, a composition of the fourth insulating film being different from a composition of the second insulating film and a composition of the third insulating film.

4. The device according to claim 1, wherein a thickness of the first insulating film is 2.5 nm or less.

* * * * *